(12) United States Patent
Hirata et al.

(10) Patent No.: US 7,374,806 B2
(45) Date of Patent: May 20, 2008

(54) OPTICAL INFORMATION MEDIUM

(75) Inventors: Hideki Hirata, Tokyo (JP); Tsuyoshi Komaki, Tokyo (JP); Tomoki Ushida, Tokyo (JP); Juichi Fujimoto, Aichi (JP); Kouji Hayama, Aichi (JP)

(73) Assignees: TDK Corporation, Tokyo (JP); Mitsubishi Rayon Co., Ltd., Tokyo (JP)

( * ) Notice: Subject to any disclaimer, the term of this patent is extended or adjusted under 35 U.S.C. 154(b) by 498 days.

(21) Appl. No.: 10/506,605

(22) PCT Filed: Mar. 10, 2003

(86) PCT No.: PCT/JP03/02763

§ 371 (c)(1),
(2), (4) Date: Sep. 10, 2004

(87) PCT Pub. No.: WO03/077243

PCT Pub. Date: Sep. 18, 2003

(65) Prior Publication Data

US 2005/0118380 A1   Jun. 2, 2005

(30) Foreign Application Priority Data

Mar. 11, 2002   (JP) ............... 2002-065212

(51) Int. Cl.
*B32B 3/02* (2006.01)
(52) U.S. Cl. .................... 428/64.4; 428/65.1
(58) Field of Classification Search ............ None
See application file for complete search history.

(56) References Cited

U.S. PATENT DOCUMENTS

| | | | |
|---|---|---|---|
| 4,719,171 A * | 1/1988 | Ikenaga et al. | 430/270.11 |
| 4,785,064 A * | 11/1988 | Hegel | 526/261 |
| 2001/0053122 A1 * | 12/2001 | Yukumoto et al. | 369/286 |
| 2005/0148739 A1 * | 7/2005 | Hara et al. | 525/452 |

FOREIGN PATENT DOCUMENTS

| | | |
|---|---|---|
| EP | 0 507 633 A2 | 10/1992 |
| EP | 1 168 320 A2 | 1/2002 |
| JP | 02-003133 | 1/1990 |
| JP | 04-261418 | 9/1992 |
| JP | 05-132534 | 5/1993 |
| JP | 05-140254 | 6/1993 |
| JP | 08-235638 | 9/1996 |
| JP | 10-007751 | 1/1998 |
| JP | 11-066618 | 3/1999 |
| JP | 11-273147 | 10/1999 |
| JP | 11279240 * | 10/1999 |
| JP | 2000-339761 | 12/2000 |
| JP | 2002-501556 | 1/2002 |
| JP | 2002-109785 | 4/2002 |
| JP | 2002-230834 | 8/2002 |
| JP | 2002-230837 | 8/2002 |
| WO | WO 85/01147 * | 3/1985 |

OTHER PUBLICATIONS

Derwent Publications, AN 1992-360904, XP-002330390, JP 04-261418, Sep. 17, 1992.

* cited by examiner

*Primary Examiner*—Mark F. Huff
*Assistant Examiner*—Anna L. Verderame
(74) *Attorney, Agent, or Firm*—Oblon, Spivak, McClelland, Maier & Neustadt, P.C.

(57) ABSTRACT

An optical information medium having a light transmission layer obtained by curing a composition containing a urethane di(meth)acrylate (A) of the formula (I) and the other urethane di(meth)acrylate (B), and having a tensile elastic modulus of 600 to 1300 MPa at 25° C. and a light transmittance of 80% or more at wavelength of 400 nm (in the formula, $R_1$=an alicyclic diisocyanate residue, $R_2$=an alkylene group or an organic group containing a cycloalkyl group or ester bond, $R_3$=H or methyl group.):

(I)

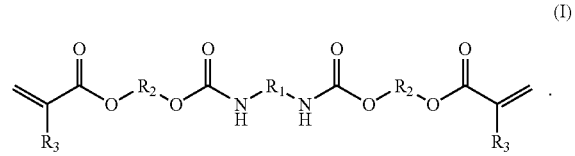

7 Claims, No Drawings

OPTICAL INFORMATION MEDIUM

TECHNICAL FIELD

The present invention relates to an optical information medium such as a read-only optical disk and recordable optical disk, more specifically, to an optical information medium having a light transmission layer transparent particularly for blue light, obtained by curing an active energy ray-curable composition capable of forming a transparent cured substance layer excellent in mechanical strength.

BACKGROUND ART

Optical information media such as a read-only optical disk and recordable optical disk are recently significantly used as an information recording medium recording and preserving a large amount of information such as a motion picture information. For example, a compact disk among these media generally has a structure in which a reflection layer is formed of a metal thin film on a transparent substrate made of a polycarbonate on which fine grooves, embossed pit trains have been formed, and an organic protective layer having a thickness of about 5 to 20 μm is provided for preventing deterioration of this reflective layer.

On the other hand, for enhancing recording capacity, optical disks obtained by bonding two transparent substrates as described for example in Japanese Patent Application Laid-Open (JP-A) No. 08-212597, namely, DVDs (digital video disk or digital versatile disk) are widely spreading, recently.

Further, as a high density type optical disk capable of enhancing recording capacity further than DVD and recording high quality motion picture information for a long period of time, optical information media described in JP-A No. 08-235638 are suggested. This high density type optical disk is an optical information medium obtained by forming a recording layer on a transparent or opaque supporting substrate formed of plastic, then, laminating a light transmission layer having a thickness of about 100 μm on the recording layer, which is used by being irradiated with recording light and/or reading light through the light transmission layer.

Regarding a high density type optical disk, there is suggested further increase in density by short wavelength recording utilizing laser light having wavelength shorter than red laser, for example, having a wavelength of 400 nm, used for recording and/or reading of conventional optical information media such as a compact disk and DVD, as described in JP-A No. 11-273147.

As a method of forming a light transmission layer, there are listed, for example, (1) a method of bonding a film of a thermoplastic material such as a polycarbonate or a glass plate on a recording layer using an ultraviolet-curable resin, (2) a method of applying an ultraviolet-curable resin on a recording layer by a spin coat method, then, irradiating with ultraviolet to obtain a light transmission layer, as described in JP-A No. 08-235638.

When a thermoplastic transparent plastic film is used in the above-mentioned light transmission layer forming method (1) described in JP-A No. 08-235638, there is a problem of deterioration in its scratch resistance, and when a glass plate is pasted, there is a problem that weight is large and handling is inferior though scratch resistance is superior. There is also a problem that a light transmission layer made of glass cracks easily by impact from outside.

As ultraviolet-curable resins usable in the above-mentioned light transmission layer forming method (2), there are mentioned ultraviolet-curable resins described in JP-A No. 03-131605. However, a light transmission layer is formed using this curable resin, its scratch resistance is more excellent than that of a transparent film made of plastic as described above, however, since transmittance for light having a wavelength of about 400 nm is low, short wavelength recording is difficult, and since the curable resin shows high volume shrinkage in curing, significant skew occurs on an optical disk, these being practical problems.

DISCLOSURE OF INVENTION

The present invention has been made to solve the above-mentioned problems in the prior arts. Namely, an object of the present invention is to provide an optical information medium equipped with a light transmission layer having excellent transparency and having excellent abrasion resistance, recording film protective ability and mechanical property.

The present inventors have intensively studied to solve the above-mentioned problems, and resultantly found that it is very effective to use a cured substance having elastic modulus and light transmittance in given ranges obtained by curing a specific active energy ray-curable composition, as a light transmission layer, and then completed the present invention.

Namely, the present invention is an optical information medium comprising a supporting substrate, an information recording surface on the supporting substrate, and a light transmission layer on the information recording surface which is used by being irradiated with recording light and/or reading light through the light transmission layer, wherein the light transmission layer is a cured substance of an active energy ray-curable composition containing a urethane di(meth)acrylate compound (A) of the following general formula (I) and a urethane di(meth)acrylate compound (B) other than the compound (A), and the cured substance has a tensile elastic modulus of 600 MPa or more and 1300 MPa or less at 25° C. and a light transmittance of 80% or more at wavelength of 400 nm:

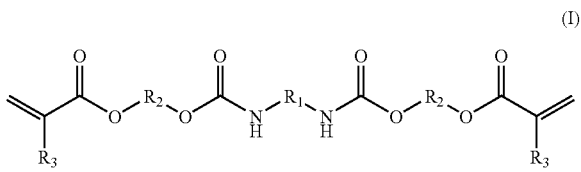

wherein, $R_1$ represents an alicyclic diisocyanate residue, $R_2$ represents an alkylene group or an organic group containing a cycloalkyl group or ester bond, and $R_3$ represents a hydrogen atom or methyl group.

In the present invention, "(meth)acrylate" is a generic term of acrylate and methacrylate.

BEST MODE FOR CARRYING OUT THE INVENTION

The optical information medium of the present invention has a structure comprising a supporting substrate, an information recording surface on the supporting substrate, and a light transmission layer on the information recording surface, and it is used by being irradiated with recording light and/or reading light through the light transmission layer.

As the supporting substrate used in the present invention, preferable are substrates for which optical properties such as light transmittance and birefringence are not required and which can transfer information pits or guide grooves correctly and have sufficient mechanical strength. For example, materials such as metal, glass, ceramics and plastic can be used. Particularly, thermoplastic resins such as polymethyl methacrylate, polycarbonate and amorphous polyolefin are suitable since conventional optical disk production processes can be utilized for these materials.

The optical information medium of the present invention has a recording layer as an information recording surface. The material of this recording layer is not particularly restricted, and materials applicable to a read-only type medium, phase change type recording medium, pit-formed type recording medium and magneto-optical recording medium may be used if necessary. For example, gold, silver, silver alloy, aluminum, aluminum alloy, silver•In•Te•Sb alloy, silver•In•Te•Sb•Ge alloy, Ge•Sb•Te alloy, Ge•Sn•Sb•Te alloy, Sb•Te alloy, Tb•Fe•Co alloy and dye can be used. It is also possible to provide a dielectric such as SiN, ZnS and SiO$_2$ on at least one side of a recording layer for the purpose of protecting the recording layer and obtaining optical effects.

The optical information medium of the present invention has a light transmission layer on an information recording surface. This light transmission layer is a cured substance of an active energy ray-curable composition containing a urethane di(meth)acrylate compound (A) of the following general formula (I):

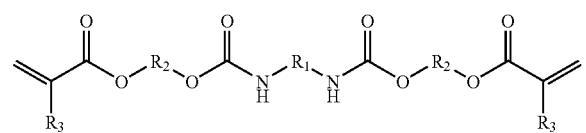

(I)

wherein, $R_1$ represents an alicyclic diisocyanate residue, $R_2$ represents an alkylene group or an organic group containing a cycloalkyl group or ester bond, and $R_3$ represents a hydrogen atom or methyl group.

and a urethane di(meth)acrylate compound (B) other than the compound (A). This cured substance has a tensile elastic modulus of 600 MPa or more and 1300 MPa or less at 25° C. and a light transmittance of 80% or more at a wavelength of 400 nm.

The urethane di(meth)acrylate compound (A) of the general formula (I) is a component for enhancing the strength of a cured substance of a curable composition. This urethane di(meth)acrylate compound (A) can be synthesized, for example, by adding a hydroxyl group-containing (meth) acrylate to an alicyclic diisocyanate compound.

Examples of the alicyclic diisocyanate compound include isophorone diisocyanate, bis(4-isocyanatocyclohexyl)methane, 1,2-hydrogenated xylylene diisocyanate, 1,4-hydrogenated xylylene diisocyanate, hydrogenated tetramethylxylylene diisocyanate and norbornane diisocyanate. Among them, isophorone diisocyanate and bis(4-isocyanatocyclohexyl)methane are preferable due to excellent strength of a cured substance. These can be used singly or in combination of two or more.

The hydroxyl group-containing (meth)acrylate to be added to an alicyclic diisocyanate compound may be specifically a hydroxyl group-containing (meth)acrylate having one (meth)acryloyloxy group in the molecule and at least one hydroxyl group in the molecule and is not particularly restricted. Specific examples thereof include hydroxyalkyl (meth)acrylates such as 2-hydroxyethyl (meth)acrylate, 2-hydroxypropyl (meth)acrylate, 4-hydroxybutyl (meth) acrylate, 6-hydroxyhexyl (meth)acrylate and cyclohexane dimethanol mono(meth)acrylate, and caprolactone adducts thereof. These can be used singly or in combination of two or more. Among them, 2-hydroxyethyl (meth)acrylate, 2-hydroxypropyl (meth)acrylate and 4-hydroxybutyl (meth)acrylate are particularly preferable due to low viscosity.

A method of adding a hydroxyl group-containing (meth) acrylate to an alicyclic diisocyanate compound is not particularly restricted, and conventionally known urethane (meth)acrylate synthesis methods can be used. Specifically, it may be advantageous that 2 to 2.2 mol of a hydroxyl group-containing (meth)acrylate and a known catalyst such as dibutyltin dilaurate is mixed in a flask in catalyst concentration of 100 to 300 ppm based on the total charge amount, and 1 mol of a diisocyanate is dropped using a dropping funnel over a period of 2 to 6 hours while keeping the temperature in the flask at 40 to 60° C.

In the present invention, the use proportion of the component (A) is preferably 5 parts by weight or more based on 100 parts by weight of the total amount of the components (A), (B) and (C) for enhancing the mechanical strength of a cured substance, and preferably 30 parts by weight or less from the standpoint of skew of an optical information medium. Further, the lower limit is particularly preferably 10 parts by weight or more, and the upper limit is particularly preferably 25 parts by weight or less.

The urethane di(meth)acrylate compound (B) used in the present invention is a urethane di(meth)acrylate compound other than the urethane di(meth)acrylate compound (A) of the above-mentioned general formula (I). This component (B) is a component for allowing a curable composition to manifest low shrinkage, and a component which is cured by co-use with the component (A) to give toughness to the resulting light transmission layer.

As the urethane di(meth)acrylate usable as the component (B), there are mentioned compounds synthesized from an isocyanate compound, poly-hydric alcohol and hydroxyl group-containing (meth)acrylate.

Examples of the isocyanate compound used for synthesizing the component (B) include diisocyanates such as hexamethylene diisocyanate, isophorone diisocyanate, bis (4-isocyanatocyclohexyl)methane, bis(4-isocyanatophenyl) methane, bis(3-chloro-4-isocyanatophenyl)methane, 2,4-tolylene diisocyanate, 2,6-tolylene diisocyanate, tris(4-isocyanatophenyl)methane, 1,2-xylylene diisocyanate, 1,4-xylylene diisocyanate, 1,2-hydrogenated xylylene diisocyanate, 1,4-hydrogenated xylylene diisocyanate, tetramethylxylylene diisocyanate, hydrogenated tetramethylxylylene diisocyanate, naphthalene diisocyanate, hexamethylene diisocyanate and norbornane diisocyanate. These can be used singly or in combination of two or more. Among them, diisocyanate compounds having an alicyclic skeleton such as isophorone diisocyanate, bis(4-isocyanatocyclohexyl)methane, 1,2-hydrogenated xylylene diisocyanate, 1,4-hydrogenated xylylene diisocyanate, hydrogenated tetramethylxylylene diisocyanate and norbornane diisocyanate are preferable since excellent toughness and hard yellowing property can be imparted to a layer of a cured substance.

The poly-hydric alcohol used for synthesizing the component (B) is not particularly restricted and for example, various poly-hydric alcohols conventionally marketed can be used. Specific examples thereof include polyether polyols such as polyethylene glycol, polypropylene glycol, polybutylene glycol and 1-methylbutylene glycol; alcohols such as neopentyl glycol, ethylene glycol, diethylene glycol, propylene glycol, 1,6-hexane diol, 1,4-butane diol, 1,9-nonane diol, 1,10-decane diol, 3-methylpentane diol, 2,4-diethylpentane diol, tricyclodecane dimethanol, 1,4-cyclohexane dimethanol, 1,2-cyclohexane dimethanol, 1,3-cyclohexane dimethanol, cyclohexane diol, hydrogenated bisphenol A, bisphenol A, trimethylolpropane and pentaerythritol; polyether-modified polyols obtained by adding an alkylene oxide such as ethylene oxide, propylene oxide and butylenes oxide to these alcohols; polyester polyols obtained by reaction of these poly-hydric alcohols with poly-basic acids such as succinic acid, phthalic acid, hexahydrophthalic acid, terephthalic acid, adipic acid, azelaic acid and tetrahydrophthalic acid or acid anhydrides of the poly-basic acids; polylactone polyols obtained by reaction of these poly-hydric alcohols with lactones such as ε-caprolactone, γ-butyrolactone, γ-valerolactone and δ-valerolactone; lactone-modified polyester polyols obtained by reaction of these poly-hydric alcohols and poly-basic acids with lactones such as ε-caprolactone, γ-butyrolactone, γ-valerolactone and δ-valerolactone; polycarbonate diols; polybutadienediols. These can be used singly or in combination of two or more.

The poly-hydric alcohol has a weight-average molecular weight preferably of 400 or more from the standpoint of low shrinkage and preferably of 2000 or less from the standpoint of low viscosity. Particularly preferable are polybutylene glycol, polycaprolactone polyols, polyester polyols and polycarbonate diols due to excellent strong ductility balance.

The hydroxyl group-containing (meth)acrylate used for synthesizing the component (B) may be specifically a hydroxyl group-containing (meth)acrylate having one (meth)acryloyloxy group in the molecule and at least one hydroxyl group in the molecule and is not particularly restricted. Specific examples thereof include (meth)acrylates such as 2-hydroxyethyl (meth)acrylate, 2-hydroxypropyl (meth)acrylate, 4-hydroxybutyl (meth)acrylate, 6-hydroxyhexyl (meth)acrylate, cyclohexane dimethanol mono(meth)acrylate, trimethylolpropane di(meth)acrylate and pentaerithritol (meth)acrylate, and caprolactone adducts thereof. These can be used singly or in combination of two or more. Among them, 2-hydroxyethyl (meth)acrylate, 2-hydroxypropyl (meth)acrylate and 4-hydroxybutyl (meth)acrylate are particularly preferable due to low viscosity.

A method of synthesizing a urethane di(meth)acrylate compound (B) is not particularly restricted, and conventionally known urethane (meth)acrylate synthesis methods can be used. Specifically, it may be advantageous that 2 mol of a diisocyanate and a known catalyst such as dibutyltin dilaurate is mixed in a flask in catalyst concentration of 100 to 300 ppm based on the total charge amount, and 1 mol of a diol compound is dropped using a dropping funnel over a period of 2 to 4 hours while keeping the temperature in the flask at 40 to 60° C. Thereafter, an equivalent amount of hydroxyl group-containing (meth)acrylate is dropped and addition-reacted to an isocyanate group remaining at the end of the resulted urethane prepolymer at a temperature in the flask of 60 to 75° C.

The urethane di(meth)acrylate compound (B) has a weight-average molecular weight preferably of 1000 or more from the stand point of low shrinkage of a curable composition and preferably of 10000 or less for lowering the viscosity of a curable composition and enhancing application workability. Further, the lower limit is preferably 2000 or more and the upper limit is 7000 or less.

In the present invention, the use proportion of the component (B) is preferably 30 parts by weight or more based on 100 parts by weight of the total amount of the components (A), (B) and (C) from the standpoint of the low shrinkage of a curable composition and preferably 90 parts by weight or less for lowering the viscosity of a curable composition and enhancing application workability. Further, the lower limit is particularly preferably 40 parts by weight or more, and the upper limit is particularly preferably 80 parts by weight or less.

In the present invention, it is also possible to further contain an ethylenically unsaturated compound (C) other than the components (A) and (B), in addition to the components (A) and (B).

Specific examples of this ethylenically unsaturated compound (C) include poly-valent (meth)acrylates such as trimethylolpropane tri(meth)acrylate, trisethoxylated methylolpropane tri(meth)acrylate, ditrimethylolpropane tetra (meth)acrylate, pentaerithritol tri(meth)acrylate, pentaerithritol tetra(meth)acrylate, ethoxylated pentaerithritol tri(meth)acrylate, ethoxylated pentaerithritol tetra(meth) acrylate, dipentaerithritol penta(meth)acrylate, dipentaerithritol hexa(meth)-acrylate, bis(2-acryloyloxyethyl) hydroxyethyl isocyanurate, bis(2-methacryloyloxyethyl) hydroxyethyl isocyanurate, tris(2-acryloyloxyethyl) isocyanurate, tris(2-methacryloyloxyethyl) isocyanurate, caprolactone-modified dipentaerithritol penta(meth)acrylate, caprolactone-modified dipentaerithritol hexa(meth) acrylate, trimethylolpropane triacrylate modified with aliphatic hydrocarbon having 2 to 5 carbon atoms, dipentaerithritol penta(meth)acrylate modified with aliphatic hydrocarbon having 2 to 5 carbon atoms and dipentaerithritol tetra(meth)acrylate modified with aliphatic hydrocarbon having 2 to 5 carbon atoms;

di(meth)acrylates such as ethylene glycol di(meth)acrylate, 1,3-butylene glycol di(meth)acrylate, 1,4-butanediol di(meth)acrylate, 1,6-hexanediol di(meth)acrylate, nonanediol di(meth)acrylate, neopentyl glycol di(meth) acrylate, methylpentanediol di(meth)acrylate, diethylpentanediol di(meth)acrylate, neopentyl glycol hydroxypivalate di(meth)acrylate, tetraethylene glycol di(meth)acrylate, tripropylene glycol di(meth)acrylate, polybutylene glycol di(meth)acrylate, tricyclodecanedimethanol di(meth)acrylate, cyclohexanedimethanol di(meth)acrylate, polyethoxylated cyclohexanedimethanol di(meth)acrylate, polypropoxylated cyclohexanedimethanol di(meth)acrylate, polyethoxylated bisphenol A di(meth)acrylate, polypropoxylated bisphenol A di(meth)acrylate, hydrogenated bisphenol A di(meth)acrylate, polyethoxylated hydrogenated bisphenol A di(meth)acrylate, polypropoxylated hydrogenated bisphenol A di(meth)acrylate, bisphenoxyfluorene ethanol di(meth)acrylate, neopentyl glycol-modified trimethylolpropane di(meth)acrylate, di(meth)acrylate of ε-caprolactone adduct (n+m=2 to 5) of neopentyl glycol hydroxypivalate, di(meth)acrylate of γ-butyrolactone adduct (n+m=2 to 5) of neopentyl glycol hydroxypivalate, di(meth) acrylate of caprolactone adduct (n+m=2 to 5) of neopentyl glycol, di(meth)acrylate of caprolactone adduct (n+m=2 to 5) of butylenes glycol, di(meth)acrylate of caprolactone adduct (n+m=2 to 5) of cyclohexanedimethanol, di(meth) acrylate of caprolactone adduct (n+m=2 to 5) of dicyclopentanediol, di(meth)acrylate of caprolactone adduct (n+m=2 to 5) of bisphenol A, di(meth)acrylate of caprolactone adduct (n+m=2 to 5) of hydrogenated bisphenol A, and di(meth)acrylate of caprolactone adduct (n+m=2 to 5) of bisphenol F;

(meth)acrylates such as 2-hydroxyethyl (meth)acrylate, 2-hydroxypropyl (meth)acrylate, 4-hydroxybutyl (meth)acrylate, tetrahydrofurfuryl (meth)acrylate, phenoxyethyl (meth)acrylate, cyclohexyl (meth)acrylate, isoborny (meth)acrylate, norbornyl (meth)acrylate, 2-(meth)acryloyloxymethyl-2-methylbicycloheptane, trimethylolpropane formal (meth)acrylate, 2-methyl-2-ethyl-1,3-dioxolanyl (meth)acrylate, adamantly (meth)acrylate, benzyl (meth)acrylate, phenyl (meth)acrylate, dicyclopentenyl (meth)acrylate, dicyclopentanyl (meth)acrylate, tetracyclododecanyl (meth)acrylate, cyclohexanedimethanol mono(meth)acrylate, 2-methoxyethyl (meth)acrylate, 3-methoxybutyl (meth)acrylate, methoxytriethylene glycol (meth)acrylate, butoxyethyl (meth)acrylate and methoxydipropylene glycol (meth)acrylate;

vinyl ether monomers such as vinyl acetate, vinyl butyrate, N-vinylformamide, N-vinylacetamide, N-vinyl-2-pyrrolidone, N-vinylcaprolactam and divinyl adipate; vinyl ethers such as ethyl vinyl ether and phenyl vinyl ether;

acrylamides such as acrylamide, N,N-dimethylacrylamide, N,N-dimethylmethacrylamide, N-methylolacrylamide, N-methoxymethylacrylamide, N-butoxymethylacrylamide, N-t-butylacrylamide, acryloylmorpholine, hydroxyethylacrylamide and methylenebisacrylamide;

polyester poly(meth)acrylates obtained by reaction of a poly-basic acid such as phthalic acid, succinic acid, hexahydrophthalic acid, tetrahydrophthalic acid, terephthalic acid, azelaic acid and adipic acid, a poly-hydric alcohol such as ethylene glycol, hexanediol, polyethylene glycol and polytetramethylene glycol, and (meth)acrylic acid or its derivative;

epoxy (meth)acrylates obtained by reacting (meth)acrylic acid or its derivative with a bisphenol type epoxy resin obtained by a condensation reaction of bisphenols such as bisphenol A, bisphenol F, bisphenol S and tetrabromobisphenol A with epichlorohydrin.

These can be used singly or in combination of two or more.

Among them, compounds having a cyclic structure in the molecule are preferable due to excellent water resistance. Specific examples of this preferable compound include tricyclodecane dimethanol di(meth)acrylate, polyethoxylated bisphenol A di(meth)acrylate, polypropoxylated bisphenol A di(meth)acrylate, polyethoxylated hydrogenated bisphenol A di(meth)acrylate, polypropoxylated hydrogenated bisphenol A di(meth)acrylate, polyethoxylated cyclohexane dimethanol di(meth)acrylate, polypropoxylated cyclohexane dimethanol di(meth)acrylate, bis(2-acryloyloxyethyl)hydroxyethyl isocyanutate, tris(2-acryloyloxyethyl) isocyanurate, tetrahydrofuryl (meth)acrylate, phenoxyethyl (meth)acrylate, cyclohexyl (meth)acrylate, isobornyl (meth)acrylate, norbornyl (meth)acrylate, 2-(meth)acryloyloxymethyl-2-methylbicycloheptane, trimethylolpropane formal (meth)acrylate, 2-methyl-2-ethyl-1,3-dioxolanyl (meth)acrylate, adamantly (meth)acrylate, benzyl (meth)acrylate, phenyl (meth)acrylate, dicyclopentenyl (meth)acrylate, dicyclopentanyl (meth)acrylate and tetracyclododecanyl (meth)acrylate.

In the present invention, the use proportion of the component (C) is preferably 5 parts by weight or more based on 100 parts by weight of the total amount of the components (A), (B) and (C) since then the viscosity of the resulting composition is low and workability of application to an optical disk is excellent, and preferably 40 parts by weight or less because of low shrinkage in curing of a composition. Further, the lower limit is particularly preferably 10 parts by weight or more, and the upper limit is particularly preferably 35 parts by weight or less.

In the present invention, a photo-polymerization initiator (D) can be further contained in a curable composition to obtain a cured substance efficiently by an ultraviolet curing method.

Specific examples of the photo-polymerization initiator (D) include benzophenone, 4,4,-bis(diethylamino)benzophenone, 2,4,6-trimethylbenzophenone, methylorthobenzoylbenzoate, 4-phenylbenzophenone, t-butylanthraquinone, 2-ethylanthraquinone, diethoxyacetophenone, 2-hydroxy-2-methyl-1-phenylpropan-1-one, benzyl dimethyl ketal, 1-hydroxycyclohexyl-phenyl ketone, benzoin methyl ether, benzoin ethyl ether, benzoyl isopropyl ether, benzoin isobutyl ether, 2-methyl-[4-(methylthio)phenyl]-2-morpholino-1-propanone, 2-benzyl-2-dimethylamino-1-(4-morpholinophenyl)-butanone-1, diethylthioxantone, isopropylthioxantone, 2,4,6-trimethylbenzoyldiphylphosphine oxide, bis(2,6-dimethoxybenzoyl)-2,4,4-trimethylpentylphosphine oxide, bis(2,4,6-trimethylbenzoyl)-phenylphosphine oxide and methylbenzoyl formate.

For example, when the wavelength of laser used for reading of an optical information medium is in the range of 380 to 800 nm, the kind and use amount of a photo-polymerization initiator are appropriately selected so that laser light necessary for reading permeates sufficiently through a cured substance layer (light transmission layer). It is particularly preferable to use a short wavelength sensitive photo-polymerization initiator so that the resulted cured substance layer does not absorb blue laser light.

Specific examples of this short wavelength sensitive photo-polymerization initiator include benzophenone, 2,4,6-trimethylbenzophenone, methylorthobenzoyl benzoate, 4-phenylbenzophenone, diethoxyacetophenone, 2-hydroxy-2-methyl-1-phenylpropan-1-one, benzyl dimethyl ketal, 1-hydroxycyclohexylphenyl ketone, benzoin methyl ether, benzoin ethyl ether, benzoin isopropyl ether, benzoin isobutyl ether and methylbenzoyl formate. Among them, benzophenone, diethoxyacetophenone, 2-hydroxy-2-methyl-1-phenylpropan-1-one, 1-hydroxycyclohexyl-phenylketone and methylbenzoyl formate are preferable from the standpoint of hard yellowing property of a cured substance.

These photo-polymerization initiators can be used singly or in combination of two or more.

In the present invention, the use amount of the photo-polymerization initiator (D) is not particularly restricted and preferably 0.001 part by weight or more based on 100 parts by weight of the total amount of the components (A), (B) and (C) from the standpoint of curing property and preferably 5 parts by weight or less from the standpoint of deep part curing property and hard yellowing property. Further, the lower limit is particularly preferably 0.01 part by weight or more, and the upper limit is particularly preferably 3 parts by weight or less.

In the curable composition used in the present invention, known additives such as a thermoplastic polymer, slipping agent, leveling agent, antioxidant, light stabilizer, ultraviolet absorber, polymerization inhibitor, silane coupling agent, inorganic filler, organic filler and inorganic filler subjected to surface organizing treatment may be appropriately compounded, if necessary, in an amount in the range not deteriorating its performance.

Among these additives, it is preferable to use an antioxidant and light stabilizer so as to prevent yellowing of a cured substance in use for a long period of time and so as not to cause disturbance in reading or writing of an optical information medium by blue laser.

Specific examples of this antioxidant and light stabilizer include commercially available various compounds such as SUMILIZER BHT, SUMILIZER S, SUMILIZER BP-76, SUMILIZER MDP-S, SUMILIZER GM, SUMILIZER BBM-S, SUMILIZER WX-R, SUMILIZER NW, SUMILIZER BP-179, SUMILIZER BP-101, SUMILIZER GA-80, SUMILIZER TNP, SUMILIZER TPP-R and SUMILIZER P-16 manufactured by Sumitomo Chemical Co., Ltd., ADEKASTAB AO-20, ADEKASTAB AO-30, ADEKASTAB AO-40, ADEKASTAB AO-50, ADEKASTAB AO-60, ADEKASTAB AO-70, ADEKASTAB AO-80, ADEKASTAB AO-330, ADEKASTAB PEP-4C, ADEKASTAB PEP-8, ADEKASTAB PEP-24G, ADEKASTAB PEP-36, ADEKASTAB HP-10, ADEKASTAB 2112, ADEKASTAB 260, ADEKASTAB 522A, ADEKASTAB 329K, ADEKASTAB 1500, ADEKASTAB C, ADEKASTAB 135A and ADEKASTAB 3010 manufactured by Asahi Denka Kogyo K.K., CHINUBIN 770, CHINUBIN 765, CHINUBIN 144, CHINUBIN 622, CHINUBIN 111, CHINUBIN 123 and CHINUBIN 292 manufactured by Chiba Specialty Chemicals K.K., FANCRYL FA-711M, FA-712HM manufactured by Hitachi Chemical Co., Ltd (all are trade names). The addition amount of an antioxidant and light stabilizer is not particularly restricted, and preferably in the range from 0.001 to 2 parts by weight, further preferably in the range from 0.01 to 1 part by weight based on 100 parts by weight of the total amount of components (A), (B) and (C).

Regarding the viscosity of a curable composition used in the present invention, the viscosity of a composition at 25° C. is preferably 1000 mPa•s or more for obtaining a film thickness of 100 μm by spin coat in a short period of time, and preferably 10000 mPa•s or less from the standpoint of easy liquid transportation. Further, the lower limit is 2000 mPa•s or more and the upper limit is 8000 mPa•s or less.

When this viscosity is 1000 mPa•s or more, it is easy to form a uniform film thickness of about 100 μm by once application, and it is not necessary to apply repeatedly twice or three times, giving a tendency of increase in productivity. When the viscosity is 10000 mPa•s or less, filtration of a composition needs no longer time, it is not necessary to elongate overshoot rotation time for forming a uniform film thickness of about 100 μm by spin coat, and it is not necessary to remarkably increase overshooting revolution for shortening overshooting time, therefore, defects such as irregular application do not occur easily and productivity tends to increase.

A method of forming a light transmission layer using a curable composition is not particularly restricted, and an application method according to a spin coat method excellent in productivity is preferable.

The optical information medium of the present invention has as a light transmission layer a cured substance obtained by curing the above-described active energy ray-curable composition until the elastic modulus at 25° C. is 600 MPa or more. When this elastic modulus is below 600 MPa, a light transmission layer tends to be inferior in scratch resistance, and when scratched, this scratch causes an error of recording/reading by laser light. Further, in the present invention, this light transmission layer has an elastic modulus of 1300 MPa or less. When this elastic modulus is increased to a high value over 1300 MPa for enhancing scratch resistance, curing shrinkage tends to increase, and skew of the resulting optical information medium easily increases, and when this skew is large, there occurs an error of recording/reading by laser light.

A cured substance constituting this light transmission layer has a tensile yield strength of preferably 20 MPa or more from the standpoint of preservation stability. When the tensile yield strength is 20 MPa or more, if stress is applied, plastic deformation does not occur easily, and mechanical properties such as tilt angle do not deteriorate easily. Further, this tensile yield strength is particularly preferably 30 MPa or more.

For curing a curable composition, it may be advantageous that light energy irradiation is conducted, for example, a curable composition is irradiated with an active energy ray such as $\alpha$, $\beta$ and $\gamma$ rays by a known method. Particularly, ultraviolet ray is preferably used. As an ultraviolet ray generation source, ultraviolet lamps generally used are preferably used from the practical and economical standpoints. Specific examples of the ultraviolet lamps include a chemical lamp, low pressure mercury lamp, high pressure mercury lamp, super high pressure mercury lamp, xenon lamp, metal halide lamp and micro wave lamp. The atmosphere for light energy irradiation may be air, or an inert gas such as nitrogen and argon. For curing a curable composition until the elastic modulus at 25° C. reaches 600 MPa or more, it is preferable to effect curing at a reaction ratio of 91% or more. More preferable, the reaction ratio is 95% or more. This reaction ratio can be measured by known means such as gel fraction measurement and infrared spectroscopy.

The thickness of a light transmission layer is preferably 30 μm or more for suppressing an optical influence by dust adhering on the surface of the layer. For suppressing skew by shrinkage of a curable composition, it is preferably 300 μm or less.

In light transmission layer, incidence of recording light and/or reading light occurs, and laser light is usually used as this light. The wavelength of laser light is not particularly restricted, and preferably selected in the range of 300 to 800 nm. From the standpoint of recording density, it is preferable that wavelength is as short as possible, and when light in ultraviolet range is utilized, a light transmission layer tends to deteriorate by yellowing. From the standpoint of balance of recording density and durability of a light transmission layer, it is preferable to utilize laser light around 400 nm as recording light and/or reading light.

It is required for a light transmission layer to be transparent against the above-mentioned laser light, and for example, the transmittance against light having wavelength of around 400 nm is preferably 80% or more for suppressing an error in recording and/or reading, and more preferably 85% or more.

The optical information medium of the present invention is preferably used in an optical recording and reading system in which recording and reading wavelength or reading wavelength $\lambda$ and the numerical aperture NA of an objective lens for recording and reading show a relation of $\lambda/NA \leq 680$. This relation of wavelength $\lambda$ and numerical aperture NA is particularly preferably $\lambda/NA \leq 580$.

The optical information medium of the present invention has a tilt angle of preferably within ±0.35°, more preferably within ±0.3°.

The present invention will be illustrated further in detail below using examples.

SYNTHESIS EXAMPLE 1

Production of Urethane Diacrylate (UA1: Component A)

(1) Into a three-necked flask having a content volume of 5 liter equipped with a stirrer, temperature controller, thermometer and condenser was charged 1110 g of isophorone diisocyanate and 0.34 g of dibutyltin dilaurate, and heated in a water bath until the inner temperature reached 70° C.

(2) 1172 g of 2-hydroxyethyl acrylate and 1.1 g of hydroquinone monomethyl ether were uniformly mixed and dissolved and the resulted liquid was charged into a dropping funnel equipped with a side tube, and this liquid in the dropping funnel was dropped by constant dropping for 6 hours while stirring the content in the flask prepared in the above-mentioned procedure (1) and keeping the temperature in the flask at 65 to 75° C., and these were stirred and reacted at the same temperature for 6 hours, to produce a urethane diacrylate. At completion of the reaction, the remaining isocyanate equivalent was confirmed to be less than 1%, obtaining a urethane diacrylate (UA1).

SYNTHESIS EXAMPLE 2

Production of Urethane Diacrylate (UA2: Component A)

(1) Into the same flask as used in Synthesis Example 1 was charged 1324 g of bis(4-isocyanatocyclohexyl)methane and 0.37 g of dibutyltin dilaurate, and heated in a water bath until the inner temperature reached 70° C.

(2) 1172 g of 2-hydroxyethyl acrylate and 1.2 g of hydroquinone monomethyl ether were uniformly mixed and dissolved and the resulted liquid was charged into a dropping funnel equipped with a side tube, and this liquid in the dropping funnel was dropped by constant dropping for 6 hours while stirring the content in the flask prepared in the above-mentioned procedure (1) and keeping the temperature in the flask at 65 to 75° C., and these were stirred and reacted at the same temperature for 6 hours, to produce a urethane diacrylate. At completion of the reaction, the remaining isocyanate equivalent was confirmed to be less than 1%, obtaining a urethane diacrylate (UA2).

SYNTHESIS EXAMPLE 3

Production of Urethane Diacrylate (UA3: Component B)

(1) Into the same flask as used in Synthesis Example 1 was charged 1324 g of bis(4-isocyanatocyclohexyl)methane and 0.5 g of dibutyltin dilaurate, and heated in a water bath until the inner temperature reached 40° C.

(2) 1325 g of polycaprolactonediol (manufactured by Daicel Chemical Industries Ltd., trade name: PLACCEL 205, average molecular weight: 530) was charged into a dropping funnel equipped with a side tube, the liquid in this dropping funnel was dropped by constant dropping for 4 hours while stirring the content in the flask prepared in the above-mentioned procedure (1) and keeping the temperature in the flask at 35 to 45° C., and these were stirred and reacted for 2 hours at the same temperature.

(3) Next, the temperature of the flask content was raised up to 50° C., the content was stirred for 1 hour at the same temperature, and 580 g of 2-hydroxyethyl acrylate and 1.6 g of hydroquinone monomethyl ether were uniformly mixed and dissolved in another dropping funnel and the resulted liquid was dropped by constant dropping for 2 hours while keeping the temperature in the flask at 55 to 65° C. Thereafter, they were reacted for 4 hours while keeping the temperature of the content in the flask at 70 to 80° C., producing a urethane diacrylate. At completion of the reaction, the remaining isocyanate equivalent was confirmed to be less than 1%, obtaining a urethane diacrylate (UA3). The weight-average molecule weight of this urethane diacrylate (UA3) was measured in terms of standard polystyrene using gel permeation chromatography (hereinafter, abbreviated as "GPC"), to find a value of 4100.

SYNTHESIS EXAMPLE 4

Production of Urethane Diacrylate (UA4: Component B)

(1) Into the same flask as used in Synthesis Example 1 was charged 1110 g of isophorone diisocyanate and 0.6 g of dibutyltin dilaurate, and heated in a water bath until the inner temperature reached 70° C.

(2) 2505 g of polycarbonatediol (manufactured by Asahi Chemical Industry Co., Ltd, trade name: CX-4710, average molecular weight: 1002) was charged into a dropping funnel equipped with a side tube, the liquid in this dropping funnel was dropped by constant dropping for 4 hours while stirring the content in the flask prepared in the above-mentioned procedure (1) and keeping the temperature in the flask at 65 to 75° C., and these were stirred and reacted for 2 hours at the same temperature.

(3) Next, the temperature of the flask content was raised up to 60° C., and 580 g of 2-hydroxyethyl acrylate and 2.1 g of hydroquinone monomethyl ether were uniformly mixed and dissolved in another dropping funnel and the resulted liquid was dropped by constant dropping for 2 hours while keeping the temperature in the flask at 55 to 65° C. Thereafter, they were reacted for 4 hours while keeping the temperature of the content in the flask at 75 to 85° C., producing a urethane diacrylate. At completion of the reaction, the remaining isocyanate equivalent was confirmed to be less than 1%, obtaining a urethane diacrylate (UA4). The weight-average molecule weight of this urethane diacrylate (UA4) was measured in terms of standard polystyrene using GPC, to find a value of 7000.

In the following examples, an optical information medium having a light transmission layer is produced using each compound obtained in Synthesis Examples 1 to 4. In the following descriptions, "parts" are by weight.

EXAMPLE 1

(1) Preparation of Active Energy Ray-Curable Composition 15 parts of the urethane diacrylate (UA1) obtained in Synthesis Example 1 as a component (A), 50 parts of the urethane diacrylate (UA3) obtained in Synthesis Example 3 as a component (B), 10 parts of tris(2-acryloyloxyethyl) isocyanurate and 25 parts of tetrahydrofurfuryl acrylate, and 3 parts of 1-hydroxycyclohexylphenylketone as a component (D) were mixed and dissolved to obtain an active energy ray-curable composition. This composition was colorless and transparent, and revealed viscous liquid condition having a viscosity at ambient temperature (25° C.) of about 3000 mPa•s.

(2) Production and Evaluation of Optical Information Medium for Evaluation

A polycarbonate resin was injection-molded, to obtain a transparent disk-shaped polycarbonate base plate (diameter 12 cm, plate thickness 1.1 mm) having a hole of a diameter of 15 mm at the center and carrying information. On this base plate, aluminum was sputtered to give a film thickness of 50 nm, forming a mirror surface aluminum reflection film. Then, on this aluminum reflection film, the curable composition prepared previously was applied using a spin coater to give an average film thickness of 100 μm. This applied film was cured by a high pressure mercury lamp (120 w/cm) having a lamp height of 10 cm at energy amount of an accumulated light quantity of 1000 mJ/cm$^2$, to obtain an optical information medium having a cured substance layer (light transmission layer).

On the resulted optical information medium, tilt angle at each position was calculated based on moved amount from previous measurement position and positional difference from the standard surface, at 8 positions (5 mm interval) along radial direction from a radius of 23 mm to 58 mm, using LM-1200 manufactured by Ono Sokki K.K. under an atmosphere of 20° C. and 50% RH, and the maximum value was selected as tilt angle. This tilt angle was –0.2°. Further, this optical information medium was aged for 50 hours under an atmosphere of 80° C. and 80% RH, then, removed and aged for 48 hours under an atmosphere of 20° C. and 50% RH, and the tilt angle was again measured to find a value of 0°, showing excellent mechanical property. The tilt angle was tolerated in a range of –0.35 to 0.35°, both after the initial test and after the durability test.

The aluminum reflection film was observed by a microscope at a magnification of 800 to find no generation corrosion such as whitening and pinhole, revealing excellent protective ability.

(3) Tensile Test of Cured Substance and Evaluation of Transparency

A cured substance layer was peeled from an aluminum reflection film of an optical information medium obtained in the same manner, and the resulted transparent film was subjected to a tensile test using a tester (manufactured by OrienTech, trade name: TRM-100 type Tensilon). The size of a specimen was 0.1 mm×60 mm×10 mm, and evaluated by a test method based on JIS 7127-1989 at an atmosphere temperature of 25° C., to find a tensile elastic modulus of 720 MPa and a tensile yield strength of 49 MPa. When apparent yield point was not observed in this tensile test, tensile yield strength was regarded as a tensile yield strength. Permanent deformation for determining this tensile yield strength was 0.5%.

The light transmittance at a wavelength of 400 nm of a transparent film obtained in the same manner was measured by a spectrophotometer (manufactured by Hitachi, Ltd., trade name: U-3400) using air as reference to find a value of 88%, showing excellent light transmittance. The light transmittance was tolerated in the range of 80% or more.

(4) Evaluation of Scratch Resistance

An optical information medium having a cured substance layer was produced in the same manner as in the above-mentioned procedure (2) excepting that a reflection film was not provided, and the scratch resistance test of a cured substance layer was conducted using a Taber abraser. Here, CS10F was used as a Taber abrasion ring, and the test was conducted under conditions of a load of 500 g and a revolution of 100. The initial haze value and haze value after the test were measured by a haze meter, and a difference thereof was evaluated as a delta haze to find a value of 8%, showing excellent scratch resistance. The delta haze was tolerable in the range of 15% or less.

EXAMPLES 2 to 5, COMPARATIVE EXAMPLES 1 to 4

Curable compositions and optical information media were produced in the same manner as in Example 1 excepting curable compositions shown in columns of Examples 2 to 5 and Comparative Examples 1 to 4 in Table 1 were used, and they were evaluated. The results are shown in Table 1.

COMPARATIVE EXAMPLE 5

The same transparent disk-shaped polycarbonate base plate as in (2) of Example 1 was prepared, and a reflection film was not provided, and on this base plate, a polycarbonate sheet having a thickness of 70 μm (a polycarbonate having a molecular weight of 40000 had been formed into a sheet by casting method) was adhered via an acrylic adhesive layer having a thickness of 30 μm, to obtain an optical information medium having a light transmission layer having a total film thickness of 100 μm The scratch resistance of the sheet of this optical information medium was evaluated in the same manner as in (4) of Example 1, to find that the delta haze thereof was 30%, and the sheet was very easily scratched and was not practical.

TABLE 1

| | | | Example | | | | | Comparative Example | | | | |
|---|---|---|---|---|---|---|---|---|---|---|---|---|
| | | | 1 | 2 | 3 | 4 | 5 | 1 | 2 | 3 | 4 | 5 |
| Curable composition | Component (A) | UA1 | 15 | | 20 | | 15 | | 60 | | | Sheet was used |
| | | UA2 | | 10 | | 25 | | | | | | |
| | Component (B) | UA3 | 50 | | 45 | 45 | | 50 | | | | |
| | | UA4 | | 55 | | | 65 | | | 60 | | |
| | Component (C) | UK6105 | | | | | | 20 | | | 10 | |
| | | TAIC | 10 | 10 | 10 | | | | 10 | | | |
| | | TMPTA | | | | 10 | | | | | 45 | |
| | | NPGDA | | | | | | | | | 40 | |
| | | TCDA | | | 10 | | | 15 | | | | |
| | | THFA | 25 | 25 | 15 | 20 | | 15 | 25 | 30 | 5 | |
| | | IBXA | | | | 10 | | | 5 | 10 | | |
| | | C9DA | | | | | 10 | | | | | |
| Component (D) | | HCPK | 3 | | | | 2 | 3 | 3 | 3 | 3 | |
| | | HMPP | | 3 | | | | | | | | |
| | | MBF | | | 3 | | | | | | | |

TABLE 1-continued

|  |  | Example | | | | | Comparative Example | | | | |
|---|---|---|---|---|---|---|---|---|---|---|---|
|  |  | 1 | 2 | 3 | 4 | 5 | 1 | 2 | 3 | 4 | 5 |
|  | DEAP |  |  |  | 3 |  |  |  |  |  |  |
|  | BNP |  |  |  |  | 1 |  |  |  | 6 |  |
|  | EPA |  |  |  |  |  |  |  |  |  | 3 |
| Evaluation result | Viscosity of composition (mPa · s) | 3000 | 6000 | 4000 | 2500 | 5000 | 5000 | 4800 | 2200 | 25 |  |
|  | Light transmittance (%) | 88 | 88 | 88 | 88 | 88 | 85 | 89 | 89 | 57 |  |
|  | Tensile elastic modulus (Mpa) | 720 | 640 | 1230 | 810 | 960 | 1500 | 1350 | 580 | 2000 |  |
|  | Tensile yield strength (Mpa) | 49 | 40 | 67 | 45 | 51 | 73 | 65 | 18 | 40 |  |
|  | Initial tilt angle (degree) | −0.2 | −0.2 | 0 | −0.2 | −0.1 | 0.3 | 0.4 | −0.2 | Note. 1 |  |
|  | Tilt angle after test (degree) | 0 | −0.2 | 0.2 | 0 | 0.1 | 0.9 | 0.9 | −0.6 | Note. 1 |  |
|  | Protective ability | Good | Good | Good | Good | Good | Good | Good | Good | Good |  |
|  | Delta haze (%) | 8 | 12 | 7 | 8 | 8 | 9 | 7 | 20 | 7 | 30 |

Abbreviations in Table 1 are as described below:
Note 1: Tilt angle is significantly out of measurable range (±1°) of measurement apparatus, consequently, un-measurable.
UK6105: bisphenol A type epoxy acrylate manufactured by Mitsubishi Rayon Co., Ltd.
TAIC: tris(2-acryloyloxyethyl) isocyanurate
TMPTA: trimethylolpropane triacrylate
NPGDA: neopentyl glycol diacrylate
TCDA: tricyclodecane dimethanol diacrylate
THFA: tetrahydrofurfuryl acrylate
IBXA: isobornyl acrylate
C9DA: 1,9-nonanediol diacrylate
HCPK: 1-hydroxy-cyclohexyl phenyl ketone
HMPP: 2-hydroxy-2-methyl-1-phenylpropan-1-one
MBF: methylbenzoyl formate
DEAP: diethoxyacetophenone
BNP: benzophenone
EPA: ethyl p-dimethylaminobenzoate As apparent from the evaluation results shown in Table 1, excellent results were obtained in any evaluation items in Examples 1 to 5.

On the other hand, in Comparative Examples 1, 2 and 4, the tensile elastic modulus of a cured substance (light transmission layer) was over 1300 MPa, curing shrinkage was too large, and the initial tilt angle of an optical information medium was too large. Further, when a protective test was effected under high temperature and high humidity, a cured substance shifted to shrinkage, and tilt angle increased. In Comparative Example 3, the tensile elastic modulus of a cured substance (light transmission layer) was below 600 MPa, and the initial tilt angle was small, however, the scratch resistance was inferior. Further, the tensile yield strength was below 20 MPa, and when protective test was conducted under high temperature and high humidity, plastic deformation was caused, and an optical information medium changed significantly toward the side of a polycarbonate base material. In Comparative Example 5, a conventional polycarbonate sheet was used, and it was found that the sheet was scratched very easily and was not practical.

INDUSTRIAL APPLICABILITY

According to the present invention, as described above, an optical information medium equipped with a light transmission layer (cured substance layer) having excellent transparency and having excellent abrasion resistance, recording film protective ability and mechanical properties can be provided. The optical information medium of the present invention is useful as various optical information media such as a read-only optical disk and recordable optical disk, and for example, extremely useful as a high density type optical information medium having a light transmission layer of about 100 μm and as an optical information medium effecting reading and/or writing using blue laser.

What is claimed is:

1. An optical information medium comprising a supporting substrate, an information recording surface on the supporting substrate, and a light transmission layer on the information recording surface which is used by being irradiated with recording light and/or reading light through the light transmission layer,
wherein the light transmission layer is a cured substance of an active energy ray-curable composition containing a urethane di(meth)acrylate compound (A) of the following general formula (I) and a urethane di(meth)acrylate compound (B) synthesized from an isocyanate compound, poly-hydric alcohol and hydroxyl group-containing (meth)acrylate, other than the compound (A), and the cured substance has a tensile elastic modulus of 600 MPa or more and 1300 MPa or less at 25° C. and a light transmittance of 80% or more at wavelength of 400 nm:

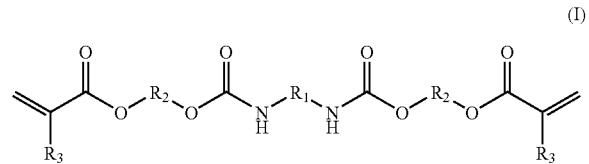

(I)

wherein, $R^1$ represents an alicyclic diisocyanate residue, $R^2$ represents an alkylene group or an organic group containing a cycloalkyl group or ester bond, and $R^3$ represents a hydrogen atom or methyl group.

2. The optical information medium according to claim 1, wherein the cured substance has a tensile yield strength of 20 MPa or more at 25° C.

3. The optical information medium according to claim 1, wherein the urethane di(meth)acrylate compound (B) has a weight-average molecular weight of 1000 to 10000.

4. The optical information medium according to claim 1, wherein the content of the urethane di(meth)acrylate compound (A) of the general formula (I) is 5 to 30 parts by weight, the content of a urethane di(meth)acrylate compound (B) other than (A) is 30 to 90 parts by weight, and the content of an ethylenically unsaturated compound (C) which is not either urethane di(meth)acrylate compound (A) or (B)

is 5 to 40 parts by weight [total amount of components (A), (B) and (C) is 100 parts by weight] in the active energy ray-curable composition.

5. The optical information medium according to claim 1, wherein the active energy ray-curable composition contains at least one photo-polymerization initiator (D) selected from the group consisting of beuzophenone, diethoxyacetophenone, 2-hydroxy-2-methyl-1-phenyipropane-1-one, 1-hydroxycyclohexyl-phenylketone and methyl benzoylformate.

6. The optical information medium according to claim 1, wherein the light transmission layer has a thickness of 30 to 300 μm.

7. The optical information medium according to claim 1, which is used in an optical recording and reading system wherein the wavelength $\lambda$ used in the recording and/or reading and the numerical aperture NA of the objective lens for recording and reading show a relation of $\lambda/NA \leq 680$.

\* \* \* \* \*